(12) United States Patent
Appeltans et al.

(10) Patent No.: US 10,127,961 B2
(45) Date of Patent: Nov. 13, 2018

(54) THREE TRANSISTOR TWO JUNCTION MAGNETORESISTIVE RANDOM-ACCESS MEMORY (MRAM) BIT CELL

(71) Applicants: IMEC VZW, Leuven (BE); Katholieke Universiteit Leuven, KU LEUVEN R&D, Leuven (BE)

(72) Inventors: Raf Appeltans, Haasrode (BE); Praveen Raghavan, Leefdaal (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 15/367,293

(22) Filed: Dec. 2, 2016

(65) Prior Publication Data

US 2017/0169873 A1 Jun. 15, 2017

(30) Foreign Application Priority Data

Dec. 9, 2015 (EP) ..................................... 15198573

(51) Int. Cl.
*G11C 11/00* (2006.01)
*G11C 11/16* (2006.01)

(52) U.S. Cl.
CPC ...... *G11C 11/1675* (2013.01); *G11C 11/1673* (2013.01)

(58) Field of Classification Search
CPC . G11C 11/1675; G11C 11/1673; H01L 43/02; H01L 27/228
USPC .......................................................... 365/158
See application file for complete search history.

(56) References Cited

U.S. PATENT DOCUMENTS

| | | | | |
|---|---|---|---|---|
| 7,272,034 B1* | 9/2007 | Chen | ....................... | G11C 11/16 365/158 |
| 8,995,180 B2* | 3/2015 | Romanovskyy | ...... | G11C 13/004 365/158 |
| 2008/0219043 A1* | 9/2008 | Yoon | ....................... | G11C 11/16 365/158 |
| 2014/0376300 A1* | 12/2014 | Hynes | ................ | G11C 13/0069 365/148 |

* cited by examiner

*Primary Examiner* — Tha-O H Bui
(74) *Attorney, Agent, or Firm* — McDonnell Boehnen Hulbert & Berghoff LLP

(57) ABSTRACT

Three transistor two junction magnetoresistive random-access memory (MRAM) bit cells provided. An example MRAM bit cell includes a first magnetic tunnel junction, MTJ, connected to a first bit line. The MRAM bit cell also includes a second MTJ connected to a second bit line. In addition, the MRAM bit cell includes a first transistor connected to the first MTJ and to a ground conductor. The MRAM bit cell further includes a second transistor connected to the second MTJ and to the ground conductor. Additionally, the MRAM bit cell includes a third transistor connected to the first transistor and to the second transistor.

8 Claims, 4 Drawing Sheets

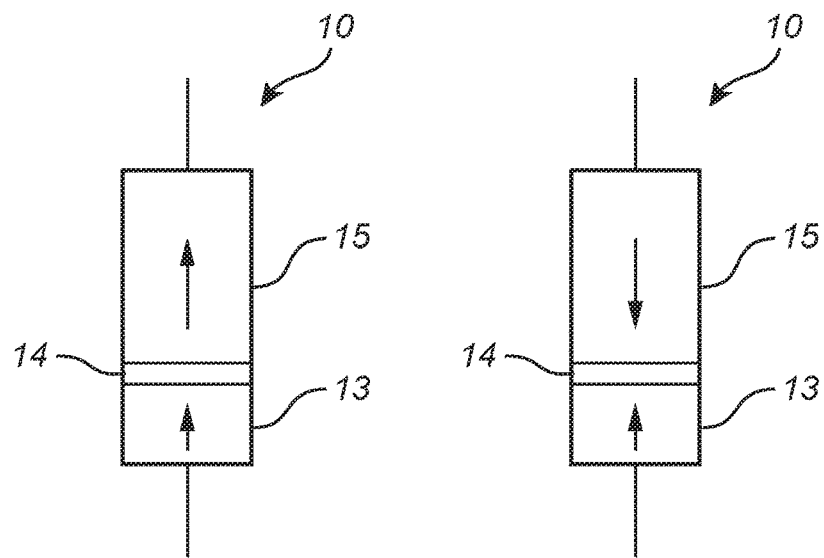
Figure 1a     Figure 1b
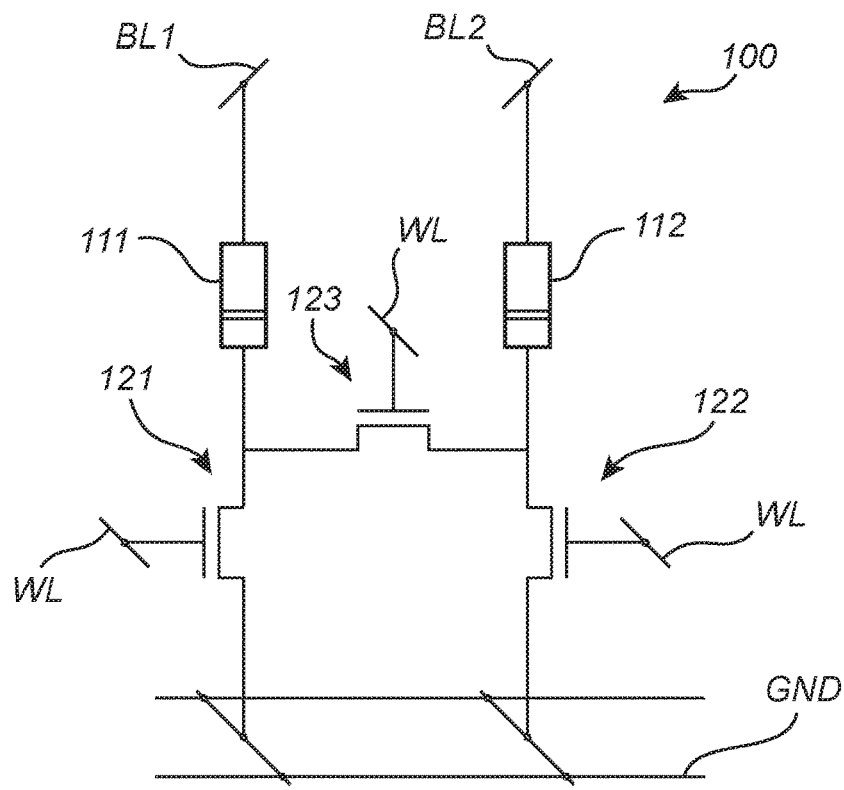
Figure 2

THREE TRANSISTOR TWO JUNCTION MAGNETORESISTIVE RANDOM-ACCESS MEMORY (MRAM) BIT CELL

CROSS-REFERENCE TO RELATED APPLICATIONS

The present application is a non-provisional patent application claiming priority to European Patent Application No. EP 15198573.6, filed Dec. 9, 2015, the contents of which are hereby incorporated by reference.

FIELD OF THE DISCLOSURE

The present disclosure relates to the field of magnetoresistive random-access memory (MRAM) bit cells, and in particular to a three transistor spin torque transfer MRAM (STT-MRAM) bit cell.

BACKGROUND

There is a growing interest in STT-MRAMs as replacements for embedded static random-access memories (SRAMs). An MRAM can be used for non-volatile storage of data in magnetic tunnel junctions (MTJs). An MTJ comprises a pinned layer and a free layer separated by a dielectric layer, wherein the relative magnetic orientation of the pinned layer and the free layer determines an electric resistance of the MTJ. The MTJ has a relatively low resistance when the magnetization of the pinned layer and the free layer are aligned in parallel and a relatively high resistance when the magnetization of the pinned layer and the free layer, respectively, are anti-parallel. The magnetization of the pinned layer may be fixed, whereas the direction of the magnetization of the free layer may be set by passing a relatively high current through the MTJ.

The tunnel magneto-resistance ratio (TMR) is a measure of the difference in resistance of the anti-parallel state and the parallel state. One drawback with existing MRAMs is their relatively low and varying TMR, which can make it difficult to tell the anti-parallel and parallel states apart during operation. One way of addressing this issue is to use a complementary cell with two MTJs in different states. Binary data may hence be stored in two different combinations of high- and low-resistance states.

Even though the complementary cell may improve readability of the MRAM bit cell, there may be a desire for a faster and more energy efficient MRAM bit cell having a reduced area.

SUMMARY

Various embodiments provide a faster and more energy efficient reading operation and/or writing operation. A further object is to provide an MRAM bit cell having a reduced area.

Some embodiments include an MRAM bit cell, a reading operation and a writing operation having the features defined in the independent claims. Various embodiments are characterized by the dependent claims.

According to one aspect of the disclosure, an MRAM bit cell is provided, having a first MTJ connected to a first bit line and a second MTJ connected to a second bit line. The first MTJ and the second MTJ are connected to a ground connector, or ground grid, by a first transistor and a second transistor, respectively, wherein a first terminal of the first transistor is connected to the first MTJ, a first terminal of the second transistor is connected to the second MTJ and a second terminal of each one of the first transistor and second transistor is connected to the ground conductor. Further, a third transistor is provided, having a first terminal connected to the first terminal of the first transistor and a second terminal connected to the first terminal of the second transistor.

According to a second aspect, a reading operation is provided in an MRAM bit cell according to the first aspect. The method comprises opening the first transistor, i.e., bringing the transistor into a conductive state, so as to allow an electric current to flow between the first MTJ and the ground conductor, opening the second transistor so as to allow an electric current to flow between the second MTJ and the ground conductor, and opening the third transistor so as to allow an electric current to flow between the first terminal of the first transistor and the first terminal of the second transistor. Further, a read current (or read voltage) is provided or applied to the first bit line and the second bit line, respectively, wherein a voltage difference (or current difference) between the first bit line and the second bit line is measured.

According to a third aspect, a writing operation is provided in an MRAM bit cell according to the first aspect. The writing operation is performed by opening the first transistor, second transistor and third transistor in a similar manner as described in connection with the reading operation. However, according to the present aspect a write current (or voltage) is provided to the first bit line or second bit line so as to allow currents to flow between the first transistor and the ground conductor, between the first MTJ and the second MTJ, and from the first MTJ to the ground conductor via the second transistor.

According to a fourth aspect, a method in an MRAM bit cell according to the first aspect is provided, wherein the first transistor, second transistor and third transistor are opened. Further, in case of a reading operation, a read current is provided or applied to the first bit line and second bit line, respectively, whereas a write current is provided to the first bit line in case of a writing operation. The write current may be larger than the read current. Alternatively, the read current may be equal to or larger than the write current for a relatively short period of time, i.e., a period of time that is sufficiently short not to cause a switch the orientation of the free layer.

The MRAM bit cell may also be referred to as a three transistor two junction (3T-2MTJ) MRAM bit cell, or a 3T-2MTJ MRAM differential bit cell. Further, the first bit line and the second bit line may be referred to as bit line and bit line bar, respectively, indicating the complementary or differential configuration of the bit cell.

The ground conductor or ground grid may be biased at a zero voltage. Additional drivers or selectors that may otherwise be used to achieve other voltages may therefore be omitted.

During operation, the word lines may be used for controlling, i.e., opening and closing, the first, second and/or third transistors so as to control the voltage over, or current flowing through, the first MTJ and the second MTJ. In other words, the transistors may be operated so as to define a current path between the first bit line and the second bit line, the first bit line and the ground conductor, and/or the second bit line and the ground conductor. The different current paths may be used for measuring e.g. the resistance of the first MTJ and the second MTJ, respectively, and to switch an MTJ from a low-resistance state to a high-resistance state and vice versa.

An MTJ is an example of a storage element that may be formed from two ferromagnetic layers separated by a tunneling layer. One of the two ferromagnetic layers, which may be referred to as the fixed or pinned layer, has a magnetization that is fixed in a particular direction. The other one of the two ferromagnetic layers, which may be referred to as the free layer, may have a magnetization direction that can be altered to two different states. The different states of the free layer may be used to represent either a logic "1" or a logic "0". In particular, the electrical resistance of an MTJ may depend on whether the free layer magnetization and fixed layer magnetization are parallel or anti-parallel with each other. For example, a logic "1" state may be represented when the free layer magnetization of the first MTJ is anti-parallel to the fixed layer magnetization of the first MTJ and the free layer magnetization of the second MTJ is parallel to the fixed layer magnetization of the second MTJ. The MTJs may be provided with an in-plane magnetic anisotropy or a perpendicular magnetic anisotropy (PMA). A memory device such as MRAM may be built from an array of individually addressable MTJs, wherein the MTJs may be addressable as a complementary duo.

The reading operation refers to the process of determining the resistance level of the first MTJ and the second MTJ, respectively, wherein the combinations high-resistance state and low-resistance state of the MTJs may indicate the binary data stored in the bit cell. During the reading operation, the first and second transistors (also referred to as access transistors) may be operated so as to connect the first MTJ and the second MTJ to the ground conductor. The data stored in the bit cell may then be determined by measuring the voltage difference between the first MTJ and the second MTJ, e.g. at the first bit line and the second bit line, respectively. The measured voltage difference may be affected by the previously discussed TMR and any transistor mismatch, i.e., differences in resistance between the first transistor and the second transistor. It is therefore desirable to reduce the transistor mismatch so as to improve the readability of the bit cell. This may be achieved by opening also the third transistor during the reading operation, thereby allowing a third current between the first transistor and the second transistor. The third transistor may hence be used to equalize out, or at least partly compensate transistor mismatch for, the access transistors so as to improve readability or a sensing margin of the bit cell.

The writing operation may refer to the process of changing or flipping the resistance level of the MTJs from the high-resistance state to the low-resistance state and vice versa. The resistance level may be changed by passing a sufficiently high current, or write current, through the MTJ. The lowest current used for switching may also be referred to as critical write current. In some embodiments, the critical write current is higher for the parallel to anti-parallel (P2AP) switch than for the anti-parallel to parallel (AP2P) switch.

The present aspects may permit the configuration of the 3T-2MTJ MRAM bit cell to allow for a differentiation between the P2AP and AP2P switching events, i.e., the use of two different write currents for the respective switching events. According to the present aspects, the write current may be boosted for the P2AP switch and partly reused for the AP2P switch. The energy consumption may therefore be reduced as compared to e.g. alternate technologies not differentiating between the AP2P switch and the P2AP switch. The writing operation will now be illustrated with an example process.

During the writing operation, all three transistors may be opened, or brought into a conductive mode, and a write current provided to the first MTJ via the first bit line. After passing the first MTJ, the write current may take three different current paths—a first path through the first transistor to the ground conductor, a second path through the third transistor and via the second MTJ to the second bit line, and a third path through the third transistor via the second transistor to the ground conductor. In other words, all current through the bit cell may flow through the first MTJ whereas the current through the second MTJ may be lower due to currents taking the first path and the third path to the ground conductor. This configuration allows for the resistance of the first path and the third path to be chosen or balanced such that the ratio of the current through the second MTJ to the total write current through the first MTJ is equal to, or larger than, the ratio of the critical write current for the AP2P switch to the critical write current for the P2AP switch.

It will be appreciated that the above writing process is an example of a writing process according to example embodiments, and that a similar operation may be applicable for examples wherein the second MTJ is switched from a parallel state to an anti-parallel state. In such case, the write current may be provided to the second MTJ via the second bit line instead, wherein a fraction of the write current through the second MTJ is used for an AP2P switch at the first MTJ.

The present aspects hence provide an MRAM bit cell wherein the reading process and the writing process may be performed while keeping the ground conductor at a zero potential and without using source lines and drivers and selectors associated therewith.

The transistors may e.g. be n-type metal-oxide-semiconductor (NMOS) transistors, p-type metal-oxide-semiconductor transistors (PMOS), bi-polar junction transistors (BJTs), thyristors or other suitable switching elements. The first transistor, second transistor and third transistor may be of the same type or of different types. Further, it will be appreciated that they may have the same size, capacity and/or resistance, or be different in those terms.

It will be appreciated that the ground grid according to some alternatives may be a supply grid. In one example, the first transistor may be an NMOS transistor having its second terminal connected to the ground grid whereas the second transistor may be a PMOS transistor having its second terminal connected to the supply grid.

According to an embodiment, the gates of the first, second and third transistors may be connected to a word line, respectively. The word line may also be referred to as a control line, by which each one of the transistors may be individually controlled based on a logic state of the respective word line.

According to an embodiment, gates of the first, second and third transistors, respectively, may be controlled by a single word line. This reduces the use of multiple word lines and drivers.

According to an embodiment, the MRAM bit cell is an STT-MRAM utilizing spin-aligned electrons to directly torque the magnetic domains of the free layer. The STT may provide for a reduction of the critical write current.

According to an embodiment, the ground conductor may be formed as a buried interconnect arranged in the Front End of Line (FEOL). The buried interconnect may be connected to the gates of the transistors by a local interconnect extending between the FEOL and the Back End of Line (BEOL). By using a buried interconnect the routing in above metal layer may be facilitated.

According to an embodiment, the ground conductor is a ground grid. The ground grid may be formed of a plurality of interconnected or stitched ground lines. The grid configuration, unlike various alternate embodiments, e.g. a single ground line, may not experience increased resistance, voltage drops and electro-migration, e.g. due to the single ground line carrying the currents of a plurality of bit cells.

It will be appreciated that other embodiments than those described above are also possible. It will also be appreciated that any of the features in the embodiments described for the MRAM bit cell according to one aspect of the disclosure may be combined with the reading operation according to the second aspect, the writing operation according to the third aspect and the method according to the fourth aspect. Further features of example embodiments will become apparent when studying the following detailed disclosure, the drawings and the appended claims. Different features of various embodiments can be combined to create embodiments other than those described in the following.

BRIEF DESCRIPTION OF THE FIGURES

The above, as well as additional, features will be better understood through the following illustrative and non-limiting detailed description of example embodiments, with reference to the appended drawings.

FIG. 1a schematically depicts an MTJ wherein the pinned layer and the free layer are in a parallel magnetization state, according to example embodiments.

FIG. 1b schematically depicts an MTJ wherein the pinned layer and the free layer are in an anti-parallel magnetization state, according to example embodiments.

FIG. 2 schematically depicts the layout of a MRAM bit cell, according to example embodiments.

Figure 3:
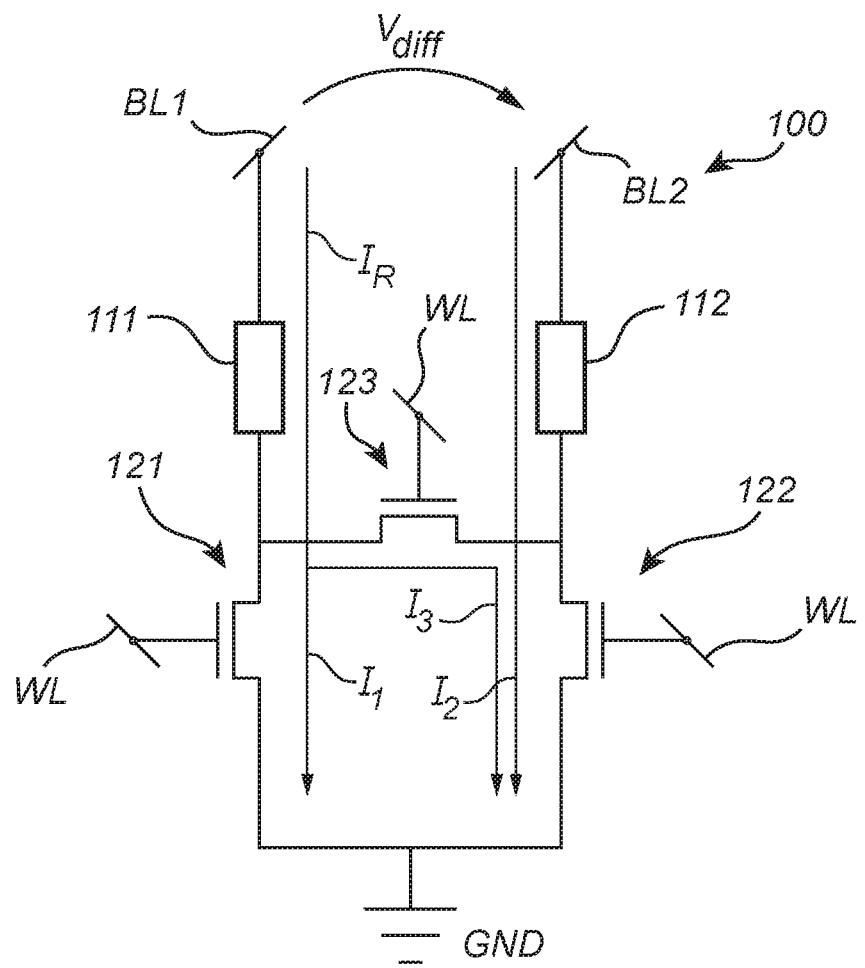
FIG. 3 schematically depicts different current paths in an MRAM bit cell during a reading operation, according to example embodiments.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

With reference to FIGS. 1a and 1b, there are shown two different magnetization states of an MTJ according to an embodiment. The MTJ 10 may comprise two ferromagnetic layers, such as a pinned or fixed layer 13 and a free layer 15, separated by a tunneling layer 14. The fixed layer 13 may have a magnetization that is fixed in a particular direction whereas the magnetization of the free layer 15 may be altered by e.g. a write current passing through the MTJ 10. The tunneling layer 14 may be formed of e.g. MgO and the ferromagnetic layers 13, 15 of e.g. CoFeB.

The direction of the magnetization of the pinned layer 13 and the free layer 15 may be parallel with each other (indicated by arrows in FIG. 1a) or anti-parallel (FIG. 1b). The electrical resistance of the MTJ 10 may be lower for a parallel magnetization state and higher for an anti-parallel magnetization state. The two different magnetization states, or resistance states, may hence be used for storing either a logic "1" or a logic "0".

In FIG. 2, a layout of an MRAM bit cell comprising two complementary MTJs similar to the MTJs described with reference to FIGS. 1a and b is depicted. The MRAM bit cell 100 may comprise a first MTJ 111 and a second MTJ 112 which may be arranged in complementary states, i.e., if the first MTJ 111 is in a parallel state the second MTJ 112 may be in the anti-parallel state, and vice versa.

The first MTJ 111 may be connected to a first bit line BL1 and the second MTJ 112 may be connected to a second bit line BL2. Further, the first MTJ 111 and the second MTJ 112 may be connected to a common ground conductor, such as a common ground grid GND, via a first transistor 121 and a second transistor 122, respectively. In the present example, the first transistor 121 and the second transistor 122 may have the drain terminal connected to the first MTJ 111 and the second MTJ 112, respectively, whereas the source terminal may be connected to the ground grid GND. The gate of the first transistor 121 and the second transistor 122 may be connected to a word line WL, respectively. The word lines WL may be parallel to each other and orthogonal to the bit lines BL1, BL2. Further, a third transistor 123 may be arranged between the first MTJ 111 and the second MTJ 112, having e.g. its drain terminal connected to the drain terminal of the first transistor 121 and its source terminal connected to the drain terminal of the second transistor 122. Similarly to the first transistor 121 and the second transistor 122, the gate of the third transistor 123 may be connected to a word line WL.

With reference to FIG. 3, a reading operation in an MRAM bit cell similarly configured as the MRAM bit cell discussed with reference to FIG. 2 is shown. During the reading operation, all three transistors 121, 122, 123 may be opened by the respective word line WL. In the conducting state, the transistors 121, 122, 123 may define three different current paths through the bit cell: a first current path $I_1$ from the first MTJ 111 via the first transistor 121 to the ground grid GND; a second current path $I_2$ from the second MTJ 112 via the second transistor 122 to the ground grid GND; and a third current path $I_3$ from the first MTJ 111 (or the second MTJ 112) via the third transistor 123 and the second transistor 122 (or the first transistor 121) to the ground grid GND. The direction of the third current path $I_3$ depends on the voltages at the drains of the first 121 and second 122 transistors, respectively, and can be oriented in either direction depending on the transistor mismatch between the first 121 and second transistor 122. The third current path $I_3$ may work in the direction that reduces the effects of the mismatch by equalizing the drains. The data stored by the bit cell 100 may be read by providing a read current $I_R$ to the first MTJ 111 and the second MTJ 112 by the first bit line BL1 and the second bit line BL2, respectively. The read current $I_R$ may pass to the ground grid GND via one or several of the first current path $I_1$, the second current path $I_2$ and the third current path $I_3$. The respective resistance states of the first MTJ 111 and the second 112, and hence the binary data stored in the bit cell 100, may be determined by measuring a voltage difference between the first bit line BL1 and the second bit line BL2. In case of a transistor mismatch between the first transistor 121 and the second transistor 122, the mismatch can be reduced or alleviated by a compensating current through the third current path $I_3$.

Figure 4:
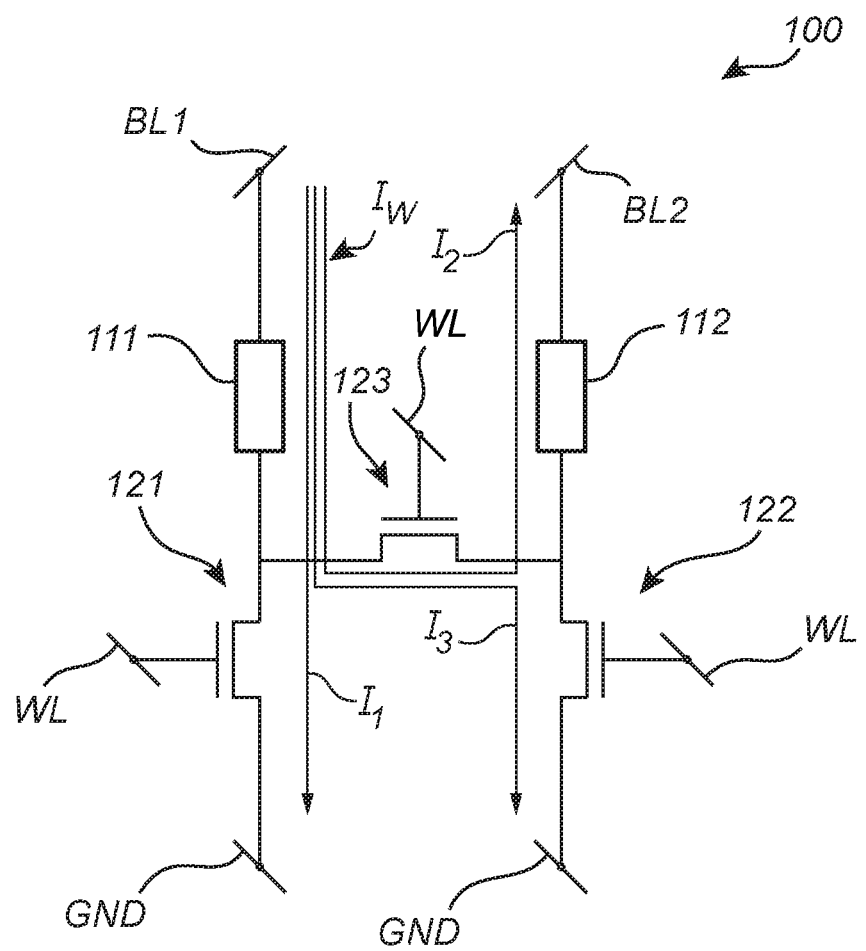
FIG. 4 schematically depicts different current paths in an MRAM bit cell during a writing operation, according to example embodiments.

FIG. 4 illustrates a writing operation, according to example embodiments. The writing operation may be performed in an MRAM bit cell similarly configured as the MRAM bit cells discussed in connection with FIGS. 2 and 3. A gate voltage, or control signal, may be applied to each one of the transistors 121, 122, 123 so as to define a first current path $I_1$ from the first MTJ 111 via the first transistor 121 to the ground grid GND, a second current path $I_2$ from the first MTJ 111 via the third transistor 123 to the second MTJ 112, and a third current path $I_3$ from the first MTJ 111 via the third transistor 123 and the second transistor 122 to the ground grid GND. During the writing operation, a write current $I_w$ may be provided to the first MTJ 111 by the first bit line BL1 and fed through the bit cell 100. The electrical resistance of the first path $I_1$ and the third path $I_3$ (and/or possibly the second path $I_2$) may be balanced such that the current $I_w$ through the first MTJ 111 is equal to or larger than a critical write current for the moment required to flip or switch the first MTJ 111 and such that the current $I_2$ through the second MTJ 112 is equal to or exceeds a critical write current for the moment required to flip or switch the second MTJ 112.

Figure 5:
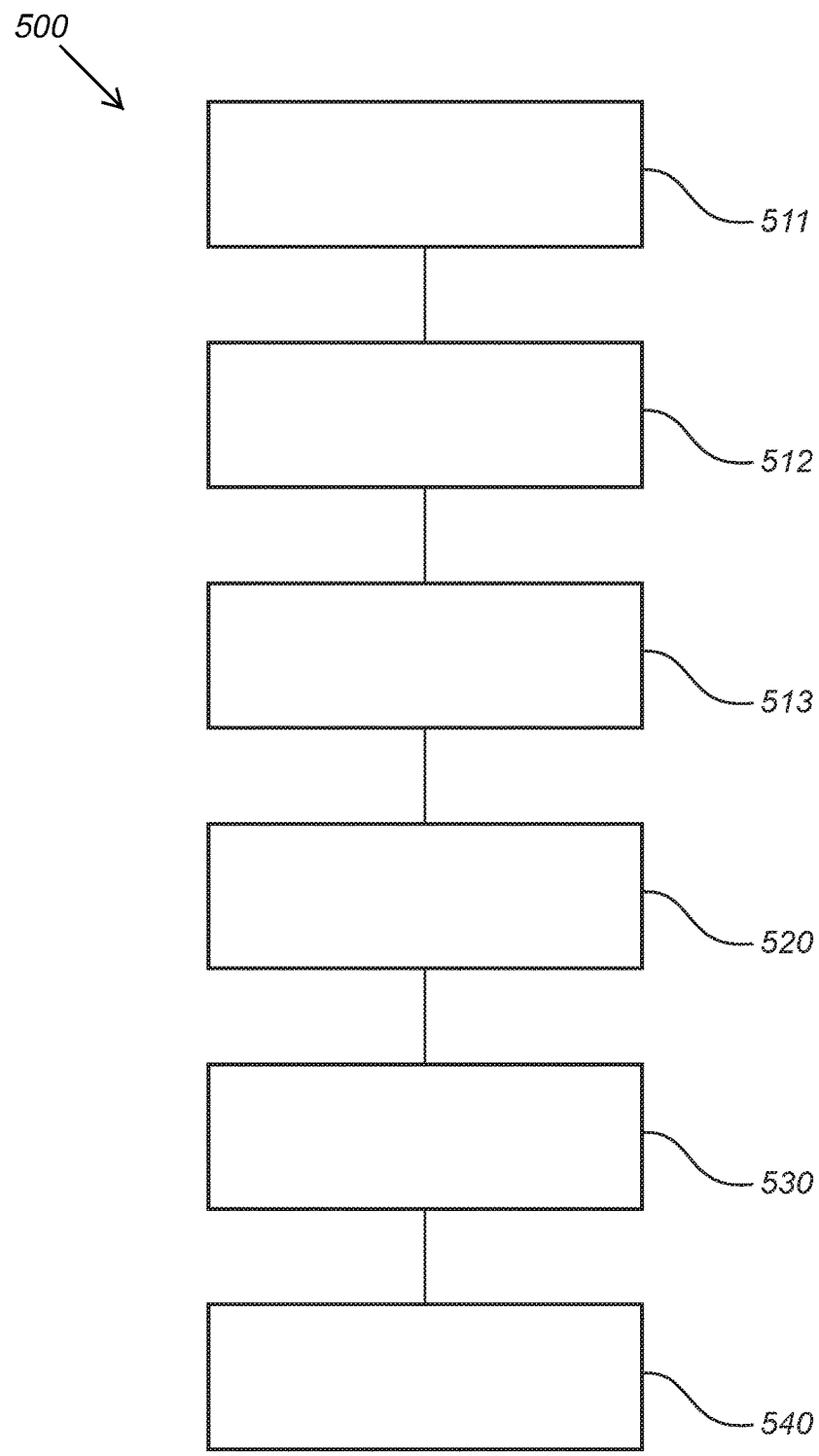
FIG. 5 is a flow chart illustrating a method in an MRAM bit cell, according to example embodiments.

FIG. 5 schematically depicts a method in an MRAM bit cell according to an embodiment. The MRAM bit cell may be similarly configured as the MRAM bit cells discussed in connection with FIGS. 2-4. The method 500 according to the present embodiment may comprise the steps of opening 511 the first transistor (i.e., bringing the transistor into a conducting state), opening 512 the second transistor and opening 513 the third transistor and, in case of a reading operation, providing 520 a read current to the first bit line and the second bit line, respectively. In case all three transistors are connected to the same word line, they would be operated or opened substantially simultaneously. In a subsequent step, a voltage difference between the first bit line and the second bit line may be measured 530. The method 500 may further, or alternatively, in case of a writing operation comprise a step of providing 540 a write current to the first bit line, wherein the write current may be larger than the read current, so as cause information to be stored in the MRAM bit cell.

In conclusion, an MRAM bit cell is disclosed. The MRAM bit cell comprises a first MTJ connected to a first bit line and a second MTJ connected to a second bit line. Further, the MRAM bit cell comprises a first transistor having a first terminal connected to the first MTJ and a second terminal connected to a ground conductor, a second transistor having a first terminal connected to the second MTJ and a second terminal connected to the ground conductor and a third transistor having a first terminal connected to the first terminal of the first transistor and a second terminal connected to the first terminal of the second transistor. A reading operation and a writing operation in the MRAM bit cell is also disclosed, and a method in such an MRAM bit cell.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A reading and writing operation in a magnetoresistive random-access memory, MRAM, bit cell comprising:
    a first magnetic tunnel junction, MTJ, connected to a first bit line;
    a second MTJ connected to a second bit line;
    a first transistor having a first terminal connected to the first MTJ, a second terminal connected to a ground conductor biased at a zero voltage, and a third terminal;
    a second transistor having a first terminal connected to the second MTJ, a second terminal connected to the ground conductor, and a third terminal;
    a third transistor having a first terminal connected to the first terminal of the first transistor, a second terminal connected to the first terminal of the second transistor, and a third terminal, wherein the respective third terminals of the first transistor, the second transistor, and the third transistor are controllable by a common word line;
    the reading operation comprising:
        providing a read current to the first bit line and the second bit line, respectively, providing a control signal on the common word line so as to:
            bring the first transistor into a conductive mode so as to allow a first current between the first MTJ and the ground conductor, bring the second transistor into a conductive mode so as to allow a second current between the second MTJ and the ground conductor, and bring the third transistor into a conductive mode so as to allow a third current between the first terminal of the first transistor and the first terminal of the second transistor; and
        measuring a voltage difference between the first bit line and the second bit line, the writing operation comprising:
    providing a control signal on the common word line so as to:
        bring the first transistor into a conductive mode so as to provide a first current path from the first MTJ via the first transistor to the ground conductor, bring the third transistor into a conductive mode so as to provide a second current path from the first MTJ via the third transistor to the second MTJ, and bring the second transistor into a conductive mode so as to provide a third current path from the first MTJ to the ground conductor via the third transistor and the second transistor; and
    providing a write current on the first bit line so as to switch, while the ground conductor remains at zero voltage, both the first MTJ and the second MTJ, wherein an electrical resistance of the first current path and the third current path are balanced such that, after the write current passes the first MTJ, a portion of the write current from the first bit line is supplied along the second current path through the second MTJ to the second bit line so as to switch the second MTJ.

2. The reading and writing operation according to claim 1, further comprising, during the reading operation, determining respective resistance states of the first MTJ and the second MTJ by measuring a voltage difference between the first bit line and the second bit line.

3. The reading and writing operation according to claim 1, wherein the MRAM bit cell comprises a spin-transfer torque MRAM.

4. The reading and writing operation according to claim 1, wherein each of the first transistor, the second transistor and the third transistor are controllable during a read operation and a write operation.

5. The reading and writing operation according to claim 1, wherein the ground conductor comprises a ground grid.

6. A writing operation in a magnetoresistive random-access memory, MRAM, bit cell comprising:
- a first magnetic tunnel junction, MTJ, connected to a first bit line;
- a second MTJ connected to a second bit line;
- a first transistor having a first terminal connected to the first MTJ, a second terminal connected to a ground conductor, and a third terminal;
- a second transistor having a first terminal connected to the second MTJ, a second terminal connected to the ground conductor, and a third terminal;
- a third transistor having a first terminal connected to the first terminal of the first transistor, a second terminal connected to the first terminal of the second transistor, and a third terminal,
- wherein the respective third terminals of the first transistor, the second transistor, and the third transistor are controllable by a common word line;
- the writing operation comprising:
- providing a control signal on the common word line so as to:
  - bring the first transistor into a conductive mode so as to provide a first current path from the first MTJ via the first transistor to the ground conductor,
  - bring the third transistor into a conductive mode so as to provide a second current path from the first MTJ via the third transistor to the second MTJ, and
  - bring the second transistor into a conductive mode so as to provide a third current path from the first MTJ to the ground conductor via the third transistor and the second transistor; and
- providing a write current on the first bit line so as to switch, while the ground conductor remains at zero voltage, both the first MTJ and the second MTJ, wherein an electrical resistance of the first current path and the third current path are balanced such that, after the write current passes the first MTJ, a portion of the write current from the first bit line is supplied along the second current path through the second MTJ to the second bit line so as to switch the second MTJ.

7. The writing operation according to claim 6, wherein the first MTJ and the second MTJ are complementary MTJs, and wherein the first MTJ is in a parallel state and the second MTJ is in an anti-parallel state.

8. The writing operation according to claim 6, wherein the first MTJ is switched from a parallel to an anti-parallel state and the second MTJ is switched from an anti-parallel to a parallel state.

* * * * *